United States Patent [19]
Schmitt

[11] Patent Number: 5,900,750
[45] Date of Patent: May 4, 1999

[54] 5V OUTPUT DRIVER ON 2.5V TECHNOLOGY

[75] Inventor: Jonathan Schmitt, Bloomington, Minn.

[73] Assignee: LSI Logic Corporation, Milpitas, Calif.

[21] Appl. No.: 08/911,949

[22] Filed: Aug. 15, 1997

[51] Int. Cl.[6] .................................................. H03K 17/10
[52] U.S. Cl. ........................... 327/108; 327/112; 326/68; 326/86; 326/121
[58] Field of Search ..................... 327/108, 112, 327/333, 544; 326/62, 63, 68, 80, 81, 83, 86, 121

[56] References Cited

U.S. PATENT DOCUMENTS

| | | | |
|---|---|---|---|
| 4,123,671 | 10/1978 | Aihara et al. | 326/80 |
| 4,479,067 | 10/1984 | Fujita | 326/86 |
| 4,495,429 | 1/1985 | Oda et al. | 327/327 |
| 4,583,203 | 4/1986 | Monk | 365/189.01 |
| 5,128,560 | 7/1992 | Chern et al. | 326/81 |
| 5,266,849 | 11/1993 | Kitahara et al. | 307/475 |
| 5,300,832 | 4/1994 | Rogers | 307/475 |
| 5,321,324 | 6/1994 | Hardee et al. | 307/475 |
| 5,338,978 | 8/1994 | Larsen et al. | 307/443 |
| 5,406,141 | 4/1995 | Yero et al. | 326/68 |
| 5,410,267 | 4/1995 | Haycock et al. | 326/81 |
| 5,418,476 | 5/1995 | Strauss | 326/58 |
| 5,450,025 | 9/1995 | Shay | 326/81 |
| 5,465,069 | 11/1995 | Boiron et al. | 327/333 |
| 5,467,031 | 11/1995 | Nguyen et al. | 326/81 |
| 5,537,059 | 7/1996 | Asahina | 326/81 |
| 5,559,464 | 9/1996 | Orii et al. | 327/333 |
| 5,736,869 | 4/1998 | Wei | 326/81 |

*Primary Examiner*—Timothy P. Callahan
*Assistant Examiner*—An T. Luu

[57] ABSTRACT

An output driver for an integrated circuit. The output driver includes a core data terminal, a pad terminal, a pull-down transistor and a pull-up transistor. The pull-down and pull-up transistors are coupled to the pad terminal and have pull-down and pull-up control terminals, respectively. A first inverter circuit coupled between the core data terminal and the pull-down control terminal. First and second voltage level shifting differential amplifiers are coupled in series between the core data terminal and the pull-up control terminal.

26 Claims, 5 Drawing Sheets

Fig. 7

5V OUTPUT DRIVER ON 2.5V TECHNOLOGY

BACKGROUND OF THE INVENTION

The present invention relates to semiconductor integrated circuits and, more particularly, to an output driver which is fabricated on 2.5V technology and which drives a 5V I/O signal without exceeding transistor tolerances.

CMOS integrated circuits are typically provided with tri-state output drivers that are selectively operable between a normal drive mode and a tri-state or high impedance mode in which the drivers appear transparent to the output terminals to which they are connected. Advancements in semiconductor integrated circuit fabrication technology enable the geometries of semiconductor devices to be progressively reduced so that more devices can fit on a single integrated circuit. As a result, core voltages of the integrated circuits are being reduced to prevent damage to the small devices and to reduce overall power consumption. For example, power supplies are now being reduced from 5V to 3.3V, and from 3.3V to 2.5V.

However, low voltage CMOS devices are often interconnected at a board level to TTL logic and other devices that operate at higher supply voltages of 5V or 3.3V. If no precautions are taken, an external 5V level signal applied to the output terminal of a 2.5V tri-state driver can cause voltage drops across the transistor devices in the driver that exceed the transistor tolerances, which can cause the gate oxide of the devices to break down. It is therefore desirable to provide an output driver that can drive large voltages off of the integrated circuit without exceeding the tolerance levels of the devices within the driver.

SUMMARY OF THE INVENTION

The output driver of the present invention includes a core data terminal, a pad terminal, a pull-down transistor and a pull-up transistor. The pull-down and pull-up transistors are coupled to the pad terminal and have pull-down and pull-up control terminals, respectively. A first inverter circuit coupled between the core data terminal and the pull-down control terminal. First and second voltage level shifting differential amplifiers are coupled in series between the core data terminal and the pull-up control terminal.

In one aspect of the present invention, the output driver is fabricated on an integrated circuit which operates at a 2.5V core supply voltage. The output driver includes a core terminal for receiving a data signal and a pad terminal. A pull-down control circuit generates a pull-down control signal based on the data signal, which has a voltage range of about 2.5V. A pull-down device is coupled to the pad terminal for pulling the pad terminal substantially to 0V in response to the pull-down control signal. A pull-up control circuit generates a pull-up control signal based on the data signal, which has a voltage range of about 2.5V. A voltage level shifting circuit receives the pull-up control signal and generates a level-shifted pull-up control signal having a voltage range from about 5V to a selected bias voltage. A pull-up device is coupled to the pad terminal for pulling the pad terminal substantially to 5V in response to the level-shifted pull-up control signal.

DETAILED DESCRIPTION OF THE PREFERRED EMBODIMENTS

Figure 1:
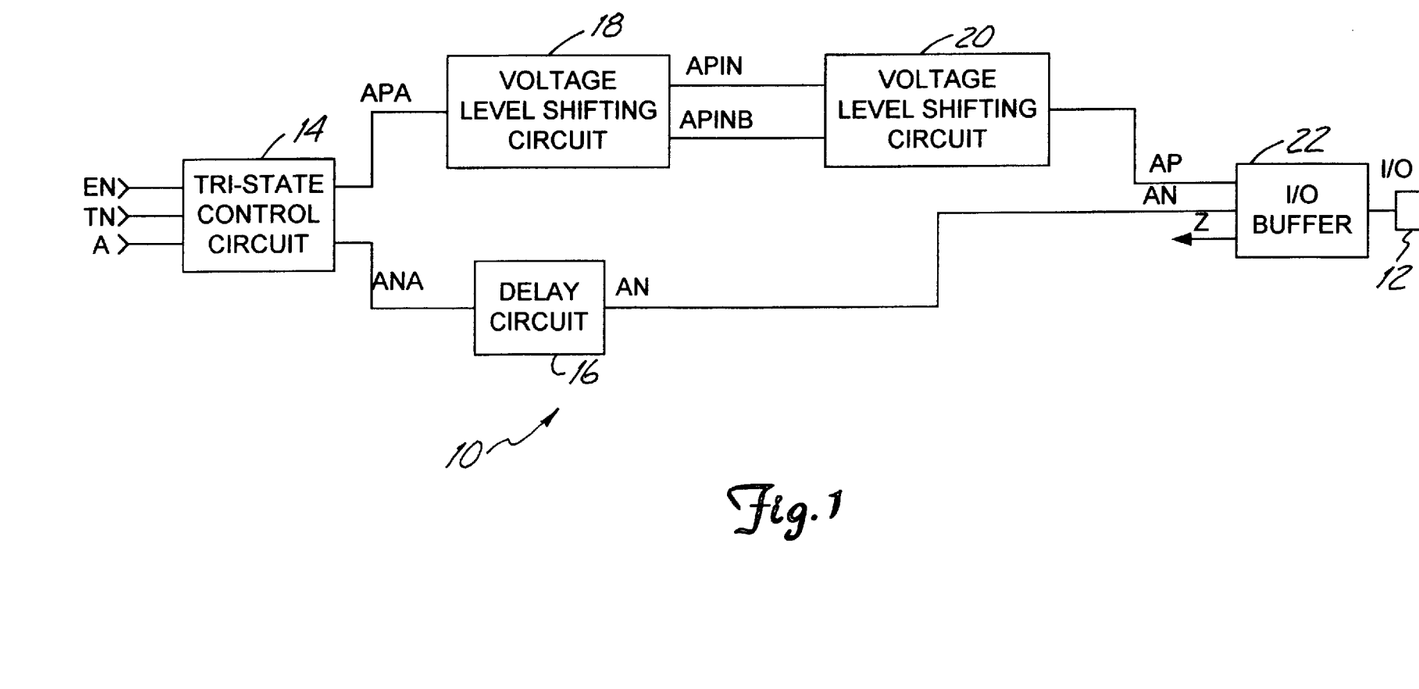
FIG. 1 is a block diagram of an I/O driver according to one embodiment of the present invention.

FIG. 1 is a block diagram of an input-output (I/O) driver according to one embodiment of the present invention. I/O driver 10 forms part of an integrated circuit which has been fabricated with a 2.5V fabrication process, for example. I/O driver 10 receives a 0–2.5V data signal from the core of the integrated circuit on data terminal A and, in response, drives a 0–5V output signal on I/O pad 12. Also, I/O driver 10 receives 0–5V data signals on I/O pad 12 and supplies a 0–2.5V data signal on data terminal Z. Each transistor in I/O driver 10 is biased such that the gate-to-source and gate-to-drain voltages are all less than a 3.0V tolerance and the drain-to-source voltages are all less than a 2.75V tolerance to prevent damage to the transistors while driving or receiving 0–5V signals on I/O pad 12.

I/O driver 10 includes tri-state control circuit 14, delay circuit 16, voltage level shifting circuits 18 and 20, delay circuit 20 and I/O buffer 22. Tri-state control circuit 14 receives 0V–2.5V data signals on data terminal A and enable signals on enable terminals EN and TN. Tri-state control circuit 14 generates a 0V–2.5V pull-down control signal on terminal ANA and a 0V–2.5V pull-up control signal on terminal APA which follow the logic level of the 0V–2.5V data signals applied to data terminal A when the enable signals applied to enable terminals EN and TN are low and high, respectively. When either the enable signal on enable terminal EN is high or the enable signal on enable terminal TN is low, tri-state control circuit 14 drives the pull-down control signal on terminal APA low and the pull-up control signal on terminal ANA high. Delay circuit 16 receives the 0V–2.5V pull-down control signal on terminal ANA and generates a delayed and inverted 2.5V–0V pull-down control signal on terminal AN.

Voltage level shifting circuit 18 receives the 0V–2.5V pull-up control signal APA and generates a pair of complementary 0.8V–3.3V pull-up control signals on terminals APIN and APINB. The 0.8V–3.3V pull-up control signals on terminals APIN and APINB have a voltage range which is shifted from the voltage range of the 0V–2.5V pull-up control signals on terminal APA. The pull-up control signal in terminal APIN is inverted with respect to the pull-up control signal on terminal APA.

Voltage level shifting circuit 20 receives the 0.8V–3.3V pull-up control signals on terminals APIN and APINB and generates a 2.5V–5V pull-up control signal on terminal AP. The 2.5V–5V pull-up control signal on terminal AP is not inverted with respect to the 0.8V–3.3V pull-up control signal on terminal APIN.

I/O buffer 22 selectively pulls I/O pad 12 high substantially to 5V in response to a 2.5V level on terminal AP. I/O buffer 22 selectively pulls I/O pad 12 low substantially to 0V in response to a 2.5V level on terminal AN. When the enable signal on enable terminal EN is high or the enable signal on enable terminal TN is low, the pull-up control signal on terminal AP will be 5V and the pull-down control signal on terminal AN will be 0V, causing I/O buffer 22 to operate in a tri-state or high impedance mode in which the buffer appears transparent to I/O pad 12. When in the tri-state mode, I/O buffer 22 applies data signals received on I/O pad 12 to data terminal Z for processing by the integrated circuit in which I/O driver 10 is fabricated.

Figure 2:
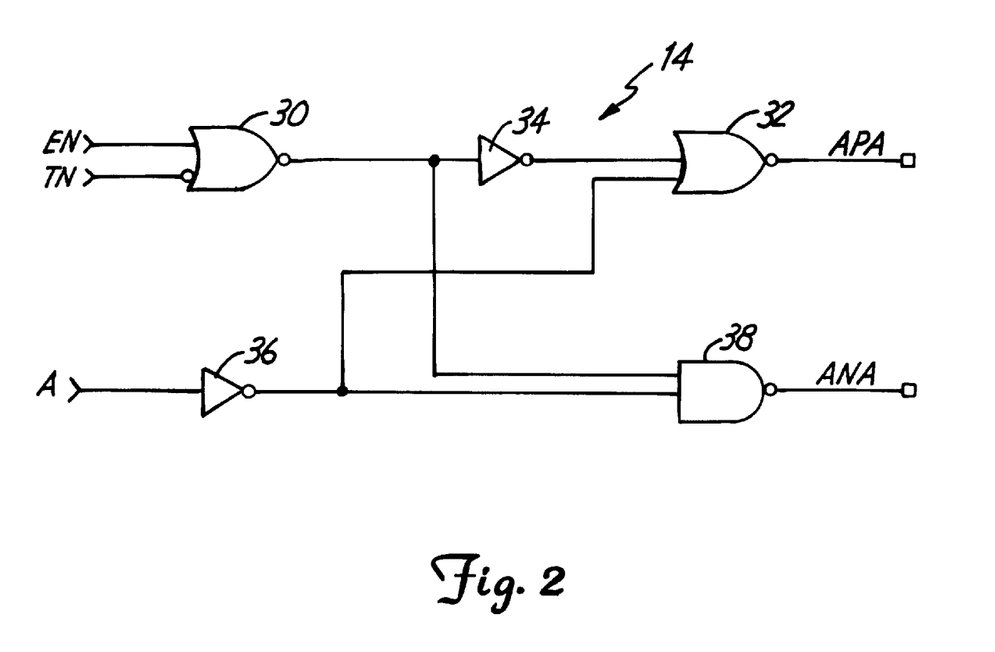
FIG. 2 is a logic diagram of a tri-state control circuit in the I/O driver shown in FIG. 1.

FIG. 2 is a logic diagram of tri-state control circuit 14. Tri-state control circuit 14 includes NOR gates 30 and 32, inverters 34 and 36 and NAND gate 38. NOR gate 30 has an active low input coupled to enable terminal EN and an active high input coupled to enable terminal TN. The output of NOR gate 30 is coupled to the input of inverter 34 and one of the inputs of NAND gate 38. The output of inverter 34 is coupled to one of the inputs of NOR gate 32. The output of NOR gate 32 is coupled to terminal APA. Data terminal A is coupled to the input of inverter 36. The output of inverter 36 is coupled to one of the inputs of NOR gate 32 and one of the inputs of NAND gate 38. The output of NAND gate 38 is coupled to terminal ANA.

During normal operation, the enable signal applied to enable terminals EN and TN are low and high, respectively, and data signals applied to data terminal A pass to terminals APA and ANA. When either enable terminal EN is high or enable terminal TN is low, NOR gate 32 drives terminal APA to a logic low state and NAND gate 38 drives terminal ANA to a logic high state.

Figure 3:
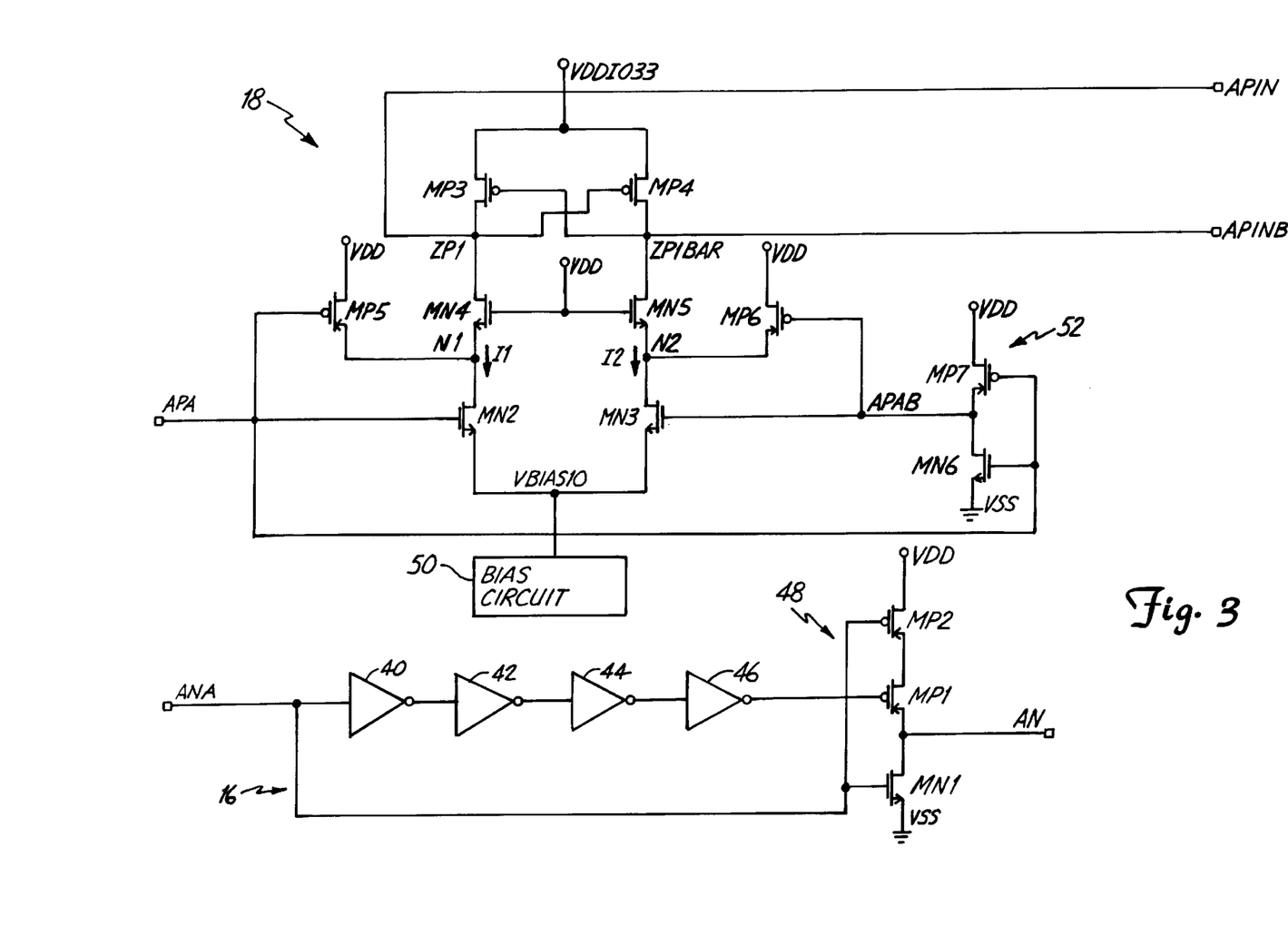
FIG. 3 is a schematic diagram of a delay circuit and a first voltage level shifting circuit in the I/O driver shown in FIG. 1.

FIG. 3 is a schematic diagram of delay circuit 16 and voltage level shifting circuit 18. Delay circuit 16 includes inverters 40, 42, 44, 46 and 48 which are coupled together in series between terminal ANA and terminal AN. Inverter 48 includes three transistors, N-channel transistor MN1 and P-channel transistors MP1 and MP2, to allow bypassing of the delay line formed by inverters 40, 42, 44 and 46 during a low-to-high transition on terminal ANA. A high-to-low transition must pass through the delay line before pulling terminal AN high though transistors MP1 and MP2. This prevents I/O buffer 22 (shown in FIG. 1) from pulling I/O pad 12 low and high at the same time, as discussed in greater detail below. Inverters 40, 42, 44, 46 and 48 are biased between voltage supply terminals VDD and VSS. Voltage supply terminals VDD and VSS are coupled to an external power supply (not shown) which provides a 2.5V core supply voltage. The pull-down control signals generated on terminal AN therefore have a voltage swing of about 0V–2.5V.

Voltage level shifting circuit 18 includes bias circuit 50, inverter 52, differential transistor pair MN2 and MN3, N-channel voltage protection transistors MN4 and MN5, P-channel cross-coupled transistor pair MP3 and MP4 and P-channel charge boosting transistors MP5 and MP6. Bias circuit 50 generates a bias voltage of about 0.8V on voltage bias node VBIAS10. Bias circuit 50 can include any suitable bias generator, such as a resistor tree, a biased current source or a self-fed inverter.

The pull-up control signals received on terminal APA are applied directly to the gate of transistor MN2 and are applied to the gate of transistor MN3 through inverter 52. Inverter 52 includes N-channel transistor MN6 and P-channel transistor MP7. Transistor MN6 has a gate coupled to terminal APA, a source coupled to voltage supply terminal VSS and a drain coupled to terminal APAB at the gate of transistor MN3. Transistor MP7 has a gate coupled to terminal APA, a source coupled to voltage supply terminal VDD and a drain coupled to terminal APAB. The gate of transistors MN2 and MN3 therefore receive complementary 0V–2.5V pull-up control signals.

Transistor MN2 has a gate coupled to terminal APA, a source coupled to voltage bias node VBIAS10 and a drain coupled to node N1. Transistor MN3 has a gate coupled to terminal APAB, a source coupled to voltage bias node VBIAS10 and a drain coupled to node N2. The drains of transistors MN2 and MN3 define first and second current paths I1 and I2, respectively. Voltage protection transistor MN4 has a gate coupled to voltage supply terminal VDD, a source coupled to node N1 and a drain coupled to output node ZP1. Voltage protection transistor MN5 has a gate coupled to voltage supply terminal VDD, a source coupled to node N2 and a drain coupled to output node ZP1BAR. Transistors MP3 and MP4 are cross coupled with one another. Transistor MP3 has a gate coupled to output node ZP1BAR and the drain of transistor MP4, a drain coupled to output node ZP1 and the gate of transistor MP4, and a source coupled to voltage supply terminal VDDIO33 and the source of transistor MP4. Output node ZP1 is coupled to terminal APIN, and output node ZP1BAR is coupled to terminal APINB. Voltage supply terminal VDDIO33 is coupled to an external power supply (not shown) which provides a 3.3V I/O supply voltage on voltage supply terminal VDDIO33.

Charge boosting transistor MP5 has a gate coupled to terminal APA, a source coupled to voltage supply terminal VDD and a drain coupled to node N1. Charge boosting transistor MP6 has a gate coupled to terminal APAB, a source coupled to voltage supply terminal VDD and a drain coupled to node N2.

The substrates of transistors MN2, MN3, MN4, MN5 and MN6 are coupled to voltage supply terminal VSS. The substrates of transistors MP5, MP6 and MP7 are coupled to voltage supply terminal VDD. The substrates of transistors MP3 and MP4 are coupled to voltage supply terminal VDDIO33.

During operation voltage level shifting circuit 18 receives the 0V–2.5V pull-up control signal on terminal APA and generates the 0.8V–3.3V complementary pull-up control signals on terminals APIN and APINB. The pull-up control signal on terminal APIN is inverted with respect to the pull-up control signal on terminal APA. If the pull-up control signal on terminal APA is high, transistor MN2 will be on and transistor MN3 will be off. Transistor MN2 pulls current through current path I1, which discharges nodes N1 and ZP1 toward the voltage level on voltage bias node VBIAS10, which is at 0.8V. The voltage level on voltage bias node VBIAS10 prevents node ZP1 from discharging below 0.8V, which prevents an over voltage condition on transistors MP3 and MP4 that would otherwise occur with the drains of these transistors being tied to 3.3V.

The low voltage on node ZP1 turns on transistor MP4 which charges nodes ZP1BAR and N2 toward 3.3V. Charge boosting transistor MP6 is a pull-up transistor which is assists transistor MP4 in charging node N2 when the voltage on terminal APA is high and the voltage on terminal APAB is low. The high voltage on node ZP1BAR turns off transistor MP3. As node N2 reaches about 2.0V, transistor MN5 turns off since its gate is tied to 2.5V and thereafter prevents further charging of node N2. This prevents node N2 from reaching 3.3V and an over voltage condition with respect to the gate of transistor MN3, which is at 0V. With node ZP1 at about 0.8V and output node ZP1BAR at about 3.3V, pull-up control terminals APIN and APINB assume complementary, level-shifted voltages of 0.8V and 3.3V, respectively.

When the pull-up control signal on terminal APA goes low, transistor MN2 turns off and transistor MN3 turns on. Transistor MN3 discharges nodes N2 and ZP1BAR toward 0.8V. The low voltage on node ZP1BAR turns on transistor MP3, which charges nodes ZP1 and N1 toward 3.3V and turns off transistor MP4. Charge boosting transistor MP5 is a pull-up transistor which assists transistor MP3 in charging node N1 when the voltage on terminal APA is low. As node N1 reaches about 2.0V, transistor MN4 turns off since its gate is tied to 2.5V. This prevents further charging of node N1 and thereby protects transistor MN2 from an over voltage condition. With node ZP1 at about 3.3V and node ZP1BAR at about 0.8V, terminals APIN and APINB assume complementary, level-shifted voltages of 3.3V and 0.8V, respectively.

Figure 4:
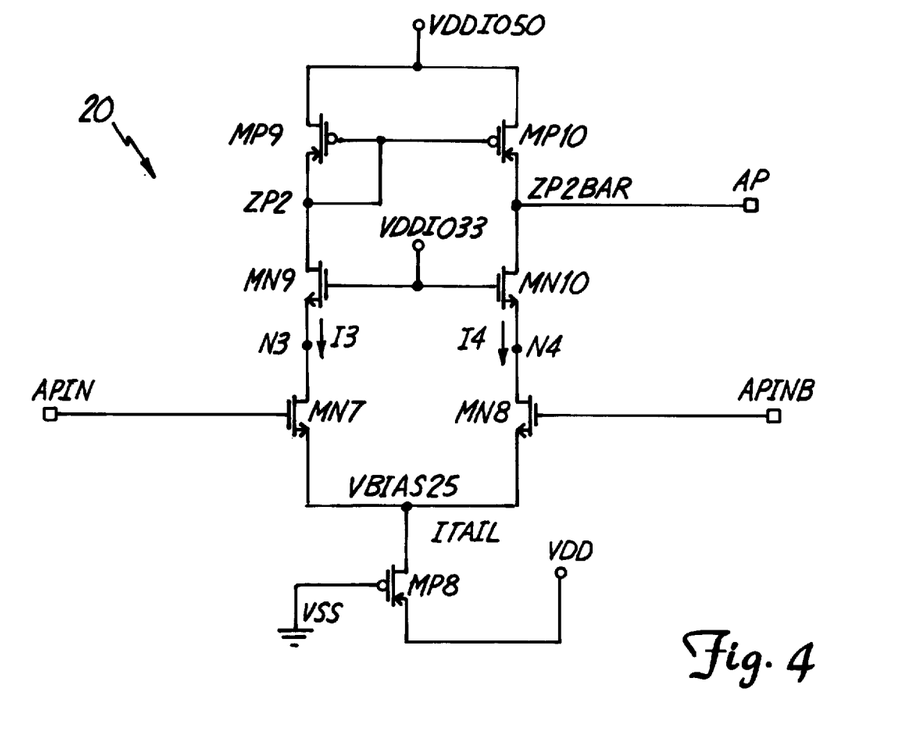
FIG. 4 is a schematic diagram of a second voltage level shifting circuit in the I/O driver shown in FIG. 1.

FIG. 4 is a schematic diagram of voltage level shifting circuit 20. Voltage level shifting circuit 20 receives the complementary 0.8V–3.3V pull-up control signals on terminals APIN and APINB and generates a 2.5V–5.0V pull-up control signal on terminal AP. Voltage level shifting circuit 20 is essentially a level-shifting differential amplifier which includes P-channel tail current source transistor MP8, N-channel differential transistor pair MN7 and MN8, N-channel voltage protection transistors MN9 and MN10 and current mirror transistors MP9 and MP10. Transistor MP8 has a gate coupled to voltage supply terminal VSS, a source coupled to bias node VBIAS25, and a drain coupled to voltage supply terminal VDD. Transistor MN7 has a gate coupled to terminal APIN, a source coupled to voltage supply terminal VBIAS25 and a drain coupled to node N3. Transistor MN8 has a gate coupled to terminal APINB, a source coupled to voltage bias terminal VBIAS25 and a drain coupled to node N4. The drains of transistors MN7 and MN8 define current paths I3 and I4 in the differential amplifier.

Transistor MN9 has a gate coupled to voltage supply terminal VDDIO33, a source coupled to node N3 and a drain coupled to node ZP2. Transistor MN10 has a gate coupled to voltage supply terminal VDDIO33, a source coupled to node N4 and a drain coupled to node ZP2BAR. Transistors MP9 and MP10 are coupled to one another to form a current mirror. Transistor MP9 has a gate and drain coupled to the gate of transistor MP10 and to node ZP2. The sources of transistors MP9 and MP10 are coupled to voltage supply terminal VDDIO50. The drain of transistor MP10 is coupled to node ZP2BAR. Voltage supply terminal VDDIO50 is coupled to an external power supply (not shown) which supplies a 5V I/O supply voltage on voltage supply terminal VDDIO50.

The substrate of transistor MP8 is coupled to voltage supply terminal VDDIO33. The substrates of transistors MN7–MN10 are coupled to voltage bias node VBIAS10. The substrates of transistors MP9 and MP10 are coupled to voltage supply terminal VDDIO50. The substrates of transistors MN7–MN10 are isolated at VBIAS10 to prevent gate-to-bulk over voltage conditions. However, is the fabrication process does not require the gate-to-bulk voltage to be less than 3V, then the substrates of transistors MN7–MN10 can be coupled to voltage supply terminal VSS.

During operation, transistor MP8 sets the voltage on voltage bias node VBIAS25 at about 2.5V and supplies a tail current ITAIL which is directed through current path I3 or I4 as a function of the relative logic states on terminals APIN and APINB. When terminal APIN is low at 0.8V and terminal APINB is high at 3.3V, transistor MN7 is off and transistor MN8 is on. Transistor MN8 discharges nodes N4 and ZP2BAR toward 2.5V at VBIAS25. Transistor MP9 charges nodes N3 and ZP2 toward 5V. As node N3 reaches about 2.5V, transistor MN9 turns off since its gate is tied 3.3V, thereby preventing further charging of node N3. This prevents an over voltage condition that would otherwise occur since the gate of transistor MN7 is at 0.8V.

If terminal APIN is high at 3.3V and terminal APINB is low at 0.8V, transistor MN7 is on and transistor MN8 is off. Transistor MN7 discharges nodes N3 and ZP2 toward the 2.5V level at voltage bias node VBIAS25. The low voltage on node ZP2 turns on transistor MP10 which charges nodes ZP2BAR and N4 toward 5V. As node N4 reaches about 2.5V, transistor MN10 turns off since its gate is tied to 3.3V. This prevents further charging of node N4 and an over voltage condition with respect to the gate of transistor MN8, which is at 0.8V.

Figure 5:
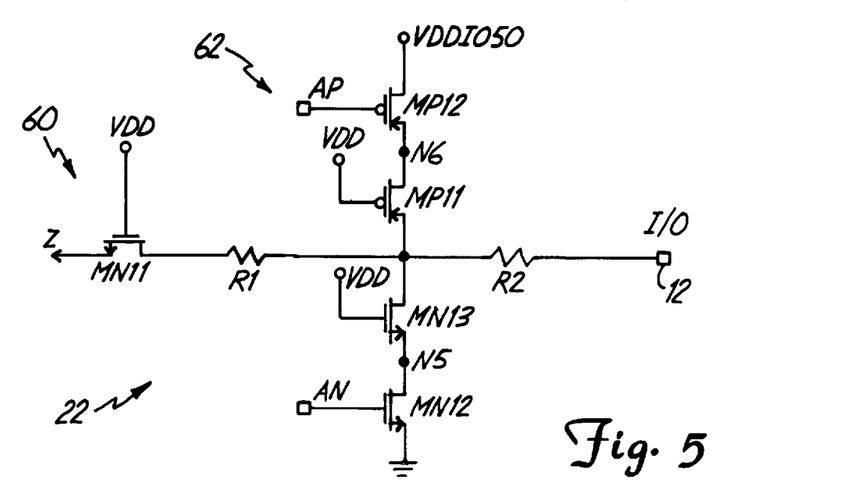
FIG. 5 is a schematic diagram of a I/O buffer in the I/O driver shown in FIG. 1.

FIG. 5 is a schematic diagram of I/O buffer 22. I/O buffer 22 includes input stage 60, output stage 62, polysilicon resistor R1 and electrostatic discharge (ESD) protection resistor R2. Input stage 60 includes N-channel input transistor MN11. Input transistor MN11 has a gate coupled to voltage supply terminal VDD, a source coupled to core terminal Z and a drain coupled to resistor R1. Resistor R2 is coupled in series between resistor R1 and I/O pad 12. Data signals received on I/O pad 12 are transmitted through input transistor MN11 to core terminal Z.

Output driver stage 62 includes N-channel pull-down transistor MN12, N-channel voltage protection transistor MN13, P-channel voltage protection transistor MP11 and P-channel pull-up transistor MP12. Pull-down transistor MN12 has a gate coupled to terminal AN, a source coupled to voltage supply terminal VSSIO and a drain coupled to node N5. Voltage supply terminal VSSIO serves as a ground terminal for voltage supply terminals VDDIO33 and VDDIO50 and is at about 0V. Voltage protection transistor MN13 has a gate coupled to voltage supply terminal VDD, a source coupled to node N5 and a drain coupled to I/O pad 12 through resistor R2. Voltage protection transistor MP11 has a gate coupled to voltage supply terminal VDD, a source coupled to node N6 and a drain coupled to I/O pad 12 through resistor R2. Pull-up transistor MP12 has a gate coupled to terminal AP, a source coupled to voltage supply terminal VDDIO50 and a drain coupled to node N6. The substrates of transistors MN11, MN12 and MN13 are coupled to voltage supply terminal VSSIO. The substrates of transistors MP11 and MP12 are coupled to voltage supply terminal VDDIO50.

In tri-state mode, terminal AN is at 0V and terminal AP is at 5V. Transistors MN12 and MP12 are off, which isolates I/O pad 12 from voltage supply terminals VDDIO50 and VSSIO. Data signals received on I/O pad 12 are transmitted to core terminal Z through input transistor MN11.

In drive mode, the pull-down and pull-up control signals on terminals AN and AP pull I/O pad 12 down substantially to 0V or up substantially to 5V, depending on the logic state of the data signals received on data terminal A (shown in FIGS. 1 and 2). Pull-down transistor MN12 is driven with a voltage level of 0V–2.5V while pull-up transistor MP12 is driven with a shifted voltage level of 2.5V–5V. This protects pull-down transistor MN12 and pull-up transistor MP12 from experiencing gate-to-source, gate-to-drain, and gate-to-bulk voltage drops of greater than 3.0V.

When terminal AP is low at 2.5V, pull-up transistor MP12 turns on, which charge node N6, I/O terminal 12 and node N5 toward 5V. As node N5 reaches about 2.0V, voltage protection transistor MN13 turns off since its gate is tied to 2.5V. This prevents further charging of node N5, which protects pull-down transistor MN12 from an over voltage condition. Since the gate of voltage protection transistor MP11 is tied to 2.5V, the gate-to-source, gate-to-drain and gate-to-bulk voltages of transistor MP11 are kept to less than the transistor tolerance of 3.0V when I/O pad 12 is driven to 5V.

As described above, the logic high level on data terminal A and thus on terminal APA (shown in FIGS. 1 and 2) bypasses the delay line formed by inverters 40, 42, 44 and 46 and pulls terminal AN low which quickly turns off pull-down transistor MN12 before pull-up transistor MP12 turns on. This prevents transistors MN12 and MP12 from being on at the same time during a low-to-high transition on data terminal A.

When data terminal A goes low, the pull-down control signal on terminal AN goes high to 2.5V, through the delay line formed by inverters 40, 42, 44, 46 and 48. The pull-up control signal on terminal AP goes high to 5.0V. Due to the delay, pull-up transistor MP12 turns off before pull-down transistor MN12 turns on. Pull-down transistor MN12 discharges node N5, I/O pad 12 and node N6 toward 0V. As node N6 drops below the voltage on the gate of voltage protection transistor MP11, transistor MP11 turns off preventing further discharge of node N6 and an over voltage condition on pull-up transistor MP12.

In one embodiment, the gate lengths of the transistors closest to I/O pad 12 are elongated as a precautionary measure to prevent the voltage drops from the source to the drain of these transistors from exceeding the transistor tolerances when driving or receiving 5.0V on I/O pad 12.

Figure 6:
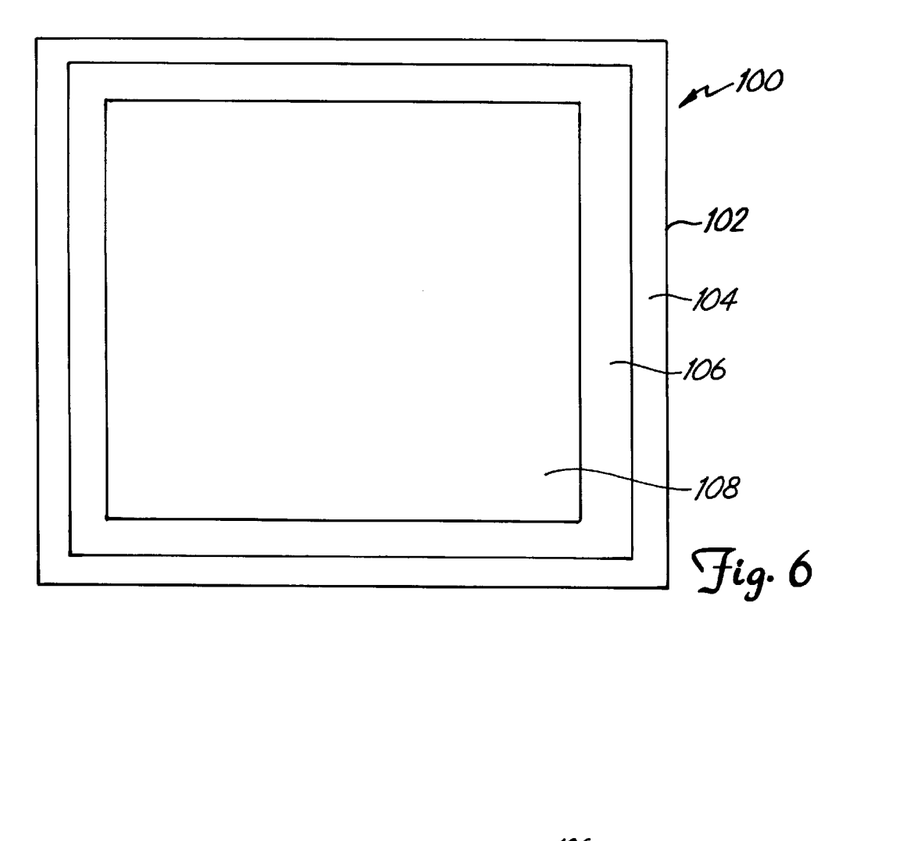
FIG. 6 is a plan view of a semiconductor die on which the I/O driver of the present invention is fabricated.

FIG. 6 is a plan view of a semiconductor die on which the I/O driver shown in FIGS. 1–5 is fabricated. Die 100 includes perimeter 102, scribe region 104, I/O region 106 and core region 108. I/O region 106 and core region 108 each have a plurality of semiconductor devices or cells. I/O region 106 extends along scribe region 104 and surrounds core region 108. Die 100 has a plurality or routing layers for routing interconnections between the devices within I/O region 106 and core region 108. Each interconnection or "wire" includes one or more segments of conductive material which are routed in a specified pattern within the various routing layers on die 100.

Figure 7:
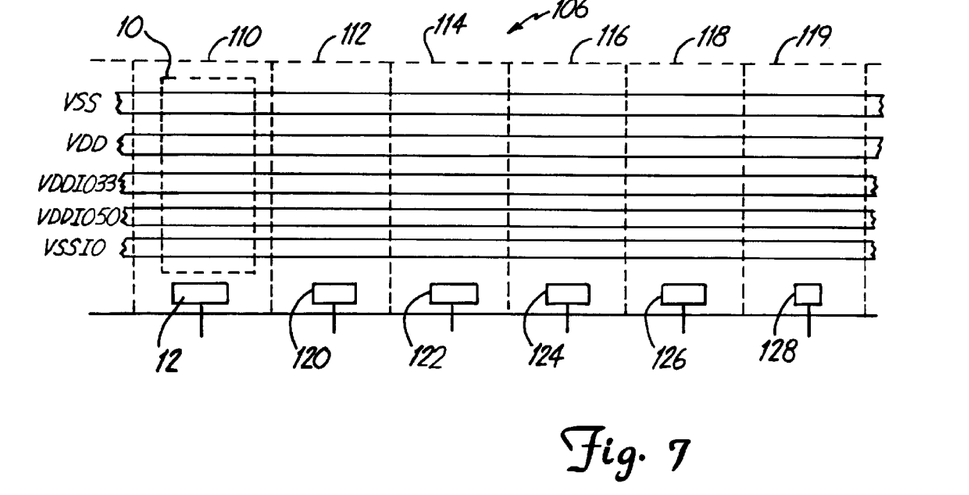
FIG. 7 is a fragmentary plan view of an I/O region of the semiconductor die shown in FIG. 6.

FIG. 7 is a plan view of an I/O slot 110 and power slots 112, 114, 116, 118 and 119 within I/O region 106. Power supply buses VDDIO50, VDDIO33, VSSIO, VDD and VSS extend along I/O region 106, generally parallel to perimeter 102. VDDIO50 and VSSIO together supply a 5.0V I/O supply voltage to the various semiconductor devices within I/O region 106 that require 5.0V. VDDIO33 and VSSIO together supply a 3.3V I/O supply voltage to the semiconductor devices within I/O region 106 that require 3.3V. VDD and VSS together supply a 2.5V core supply voltage to the semiconductor devices within core region 108 and I/O region 106 that require 2.5V.

I/O driver 10 is fabricated within I/O slot 110. I/O pad 12 is positioned along perimeter 102 within I/O slot 110 for connection to an I/O pin of the integrated circuit package in which die 100 is housed. In the embodiment shown in FIG. 7, bias circuit 50 (shown in FIG. 3) is also fabricated within I/O slot 110. In an alternative embodiments, bias circuit 50 is fabricated in one of the power slots, and voltage bias node VBIAS10 is routed as a global bus along the voltage supply buses in I/O region 106. In another embodiment, bias circuit 50 is located off-chip and the bias voltage on voltage bias node VBIAS10 is supplied to die 100 through one of the package pins.

Power and ground pads 120, 122, 124, 126, and 128 are positioned along perimeter 102 within power and ground slots 112, 114, 116, 118 and 119 for connection to the power and ground pins of the integrated circuit package. Power and ground pads 120 and 122 are coupled to power supply buses VDDIO50 and VSSIO, respectively. Power pad 124 is coupled to power supply bus VDDIO33. Power and ground pads 126 and 128 are coupled to power supply buses VDD and VSS, respectively.

Although the present invention has been described with reference to preferred embodiments, workers skilled in the art will recognize that changes may be made in form and detail without departing from the spirit and scope of the invention. For example, the I/O driver circuit can be implemented with various technologies other than CMOS and with various circuit configurations. A variety of voltage level shifting circuits can be used with the present invention. The transistors in the output driver stage can include individual transistors or an array of transistors coupled together in parallel with one another. Also, the voltage supply terminals can be relatively positive or relatively negative, depending upon the particular convention adopted and the technology used. The terms "pull-up" and "pull-down" used in the specification and the claims are arbitrary terms and can refer to either a logic high level or a logic low level depending upon the relative levels of the voltage supply terminals. Likewise, the term "coupled" can include various types of connections or couplings and can include a direct connection or a connection through one or more intermediate components.

What is claimed is:

1. An output driver for an integrated circuit, the output driver comprising:

a core terminal for receiving a data signal having a first voltage range;

a pad terminal;

pull-down control means for generating a pull-down control signal based on the data signal;

pull-down means coupled to the pad terminal for pulling the pad terminal to a logic low level in response to the pull-down control signal;

pull-up control means for generating a first pull-up control signal based on the data signal and having a second voltage range which is shifted upward from the first voltage range and for generating a second pull-up control signal based on the first pull-up control signal and having a third voltage range which is shifted upward from the second voltage range; and pull-up means coupled to the pad terminal for pulling the pad terminal to a logic high level in response to the second pull-up control signal with the third voltage range.

2. The output driver of claim 1 wherein the pull-down control means comprises an inverter coupled between the core terminal and the pull-down means.

3. The output driver of claim 1 wherein the pull-up control means comprises:

a first voltage level shifting circuit having an input coupled to the core terminal and having a first pull-up control output with the second voltage range; and a second voltage level shifting circuit having an input coupled to the first pull-up control output and having a second pull-up control output with the third voltage range, wherein the second pull-up control output is coupled to the pull-up means.

4. The output driver of claim 1 and further comprising:
a core supply terminal and a core ground terminal for supplying a core supply voltage, a first input-output (I/O) supply terminal and an I/O ground terminal for supplying a first I/O supply voltage, which is greater than the core supply voltage, a second I/O supply terminal for supplying a second I/O supply voltage relative to the I/O ground terminal which is greater than the first I/O supply voltage, a first bias terminal and a second bias terminal;

the core terminal is biased between the core supply terminal and the core ground terminal;

the pad terminal is biased between the second I/O supply terminal and the I/O ground terminal, between the pull-up means and the pull-down means; and the pull-up control means comprises:
 a first voltage level shifting circuit having an input coupled to the core terminal and having a first pull-up control output which is biased between the first I/O supply terminal and the first bias terminal; and
 a second voltage level shifting circuit having an input coupled to the first pull-up control output and having a second pull-up control output which is biased between the second I/O supply terminal and the second bias terminal, wherein the second pull-up control output is coupled to the pull-up control means.

5. The output driver of claim 4 wherein:

the pull-down means comprises a pull-down transistor which is coupled between the I/O ground terminal and the output terminal and has a pull-down control terminal which is coupled to the pull-up control means; and the pull-up means comprises a pull-up transistor which is coupled between the second I/O supply terminal and the output terminal and has a pull-up control terminal coupled to the second pull-up control output.

6. The output driver of claim 5 and further comprising:
a pull-down voltage protection transistor coupled between the output terminal and the pull-down transistor and having a control terminal coupled to the core supply terminal; and
a pull-up voltage protection transistor coupled between the pull-up transistor and the output terminal and having a control terminal coupled to the core supply terminal.

7. The output driver of claim 4 wherein the first voltage level shifting circuit comprises a voltage level shifting differential amplifier.

8. The output driver of claim 7 wherein the differential amplifier comprises:
an inverter coupled to the input of the first voltage level shifting circuit and having and output;
a differential transistor pair coupled to the first bias terminal and defining first and second current paths, the differential transistor pair having a first control terminal coupled to the input of the voltage level shifting circuit and a second control terminal coupled to the output of the inverter; and
a cross coupled transistor pair coupled in the first and second current paths between the first I/O supply terminal and the differential transistor pair and defining the first pull-up control output.

9. The output driver of claim 8 wherein the differential amplifier further comprises:

first and second voltage protection transistors coupled in the first and second current paths, respectively, between the differential transistor pair and the cross coupled transistor pair and having control terminals coupled to the core supply terminal.

10. The output driver of claim 8 and further comprising:
a first charge boosting transistor coupled between the core supply terminal and the first current path at a node between the cross coupled transistor pair and the differential transistor pair, wherein the first charge boosting transistor has a control terminal coupled to the input of the first voltage level shifting circuit; and
a second charge boosting transistor coupled between the core supply terminal and the second current path at a node between the cross coupled transistor pair and the differential transistor pair, wherein the second charge boosting transistor has a control terminal coupled to the output of the inverter.

11. The output driver of claim 4 wherein the second voltage level shifting circuit comprises a voltage level shifting differential amplifier.

12. The output driver of claim 11 wherein the first pull-up control output comprises first and second complementary pull-up control terminals and wherein the differential amplifier comprises:
a differential transistor pair coupled to the second bias terminal and defining first and second current paths, the differential transistor pair having a first control terminal coupled to the first pull-up control terminal and a second input coupled to the second pull-up control terminal; and
a current mirror transistor pair coupled in the first and second current paths between the second I/O supply terminal and the differential transistor pair and defining the second pull-up control output.

13. The output driver of claim 12 wherein the differential amplifier further comprises:
first and second voltage protection transistors coupled in the first and second current paths, respectively, between the differential transistor pair and the current mirror transistor pair and having control terminals coupled to the core supply terminal.

14. The output driver of claim 12 wherein the differential amplifier further comprises:
a tail current source coupled between the second bias node and the core supply terminal.

15. An output driver comprising:
a core data terminal and a pad terminal;
a pull-down transistor and a pull-up transistor coupled to the pad terminal and having pull-down and pull-up control terminals, respectively;
a first inverter circuit coupled between the core data terminal and the pull-down control terminal; and
first and second voltage level shifting differential amplifiers coupled in series between the core data terminal and the pull-up control terminal.

16. The output driver of claim 15 and further comprising:
a core supply terminal for supplying a core voltage;
a pull-up voltage protection transistor coupled between the pull-up transistor and the pad terminal and having a control terminal coupled to the core supply terminal; and
a pull-down voltage protection transistor coupled between the pad terminal and the pull-down transistor and having a control terminal coupled to the core supply terminal.

17. The output driver of claim 15 wherein the first differential amplifier comprises:
   a core supply terminal for supplying a core supply voltage;
   a first I/O supply terminal for supplying a first I/O supply voltage, which is greater than the core supply voltage;
   a first bias node;
   a second inverter circuit coupled to the core data terminal and having an output;
   a differential transistor pair coupled to the first bias node and defining first and second current paths, the differential transistor pair having control terminals coupled to the core data terminal and the output of the second inverter circuit, respectively; and
   a cross coupled transistor pair coupled in the first and second current paths between the first I/O supply terminal and the differential transistor pair and having a pull-up control output which is coupled to the second differential amplifier.

18. The output driver of claim 17 wherein first differential amplifier further comprises:
   first and second voltage protection transistors coupled in the first and second current paths, respectively, between the differential transistor pair and the cross coupled transistor pair and having control terminals coupled to the core supply terminal.

19. The output driver of claim 17 and further comprising:
   a first charge boosting transistor coupled between the core supply terminal and the first current path at a node between the cross coupled transistor pair and the differential transistor pair, wherein the first charge boosting transistor has a control terminal coupled to the core data terminal; and
   a second charge boosting transistor coupled between the core supply terminal and the second current path at a node between the cross coupled transistor pair and the differential transistor pair, wherein the second charge boosting transistor has a control terminal coupled to the output of the second inverter circuit.

20. The output driver of claim 15 wherein the first differential amplifier has first and second complementary pull-up control outputs and wherein the second differential amplifier comprises:
   a core supply terminal for supplying a core supply voltage;
   a first I/O supply terminal configured for supplying a first I/O supply voltage which is greater than the core supply voltage;
   a second I/O supply terminal configured for supplying a second I/O supply voltage which is greater than the first I/O supply voltage;
   a bias node;
   a differential transistor pair coupled to the bias node and defining first and second current paths, the differential transistor pair having control terminals coupled to the first and second complementary pull-up control outputs, respectively; and
   a current mirror transistor pair coupled in the first and second current paths between the second I/O supply terminal and the differential transistor pair and defining a third pull-up control output.

21. The output driver of claim 20 wherein the second differential amplifier further comprises:
   first and second voltage protection transistors coupled in the first and second current paths, respectively, between the differential transistor pair and the current mirror transistor pair and having control terminals coupled to the first I/O supply terminal.

22. The output driver of claim 20 wherein the second differential amplifier further comprises:
   a tail current source coupled between the bias node and the core supply terminal.

23. The output driver of claim 15 wherein the inverter circuit comprises a delay line formed by a plurality of inverters coupled together in series.

24. An output driver for an integrated circuit which has a core supply voltage, a first input-output (I/O) supply voltage which is greater than the core supply voltage, and a second I/O supply voltage which is greater than the first I/O supply voltage, the output driver comprising:
   a data input having a voltage swing substantially equal to the core supply voltage;
   an output terminal having a voltage swing substantially equal to the second I/O supply voltage;
   a pull-down transistor coupled to the output terminal and having a pull-down control terminal which is coupled to the data input;
   a pull-up transistor coupled to the output terminal and having a pull-up control terminal;
   a first voltage level shifting circuit having an input coupled to the data input and having a first pull-up control output with a voltage swing from the first I/O supply voltage to a selected first bias voltage; and
   a second voltage level shifting circuit having an input coupled to the first pull-up control output and having a second pull-up control output with a voltage swing from the second I/O supply voltage to a selected second bias voltage, which is greater than the first bias voltage, wherein the second pull-up control output is coupled to the pull-up control terminal.

25. An integrated circuit which operates at a 2.5V core supply voltage, the integrated circuit comprising:
   a core terminal for receiving a data signal;
   a pad terminal;
   means for generating a pull-down control signal based on the data signal, which has a voltage range of about 2.5V;
   means for generating a pull-up control signal based on the data signal, which has a voltage range of about 2.5V;
   voltage level shifting means for receiving the pull-up control signal and for generating a level-shifted pull-up control signal having a voltage range from about 5V to a selected bias voltage;
   pull-up means for pulling the pad terminal substantially to 5V in response to the level-shifted pull-up control signal; and
   pull-down means for pulling the pad terminal substantially to 0V in response to the pull-down control signal.

26. An output driver comprising:
   a pad terminal;
   a core supply terminal for supplying a core supply voltage;
   a first input-output (I/O) supply terminal for supplying a first I/O voltage which is greater than the core supply voltage;
   a second I/O supply terminal for supplying second I/O voltage which is greater than the first I/O supply voltage;
   a ground supply terminal;

a bias terminal which is biased to provide a bias voltage which is at least as great as the core voltage;

a pull-up transistor coupled between the second I/O supply terminal and a pull-up node and having a pull-up control terminal which is biased between the second I/O supply terminal and the bias terminal;

a pull-up voltage protection transistor coupled between the pull-up node and the pad terminal and having a control terminal coupled to the core supply terminal;

a pull-down transistor coupled between the ground supply terminal and a pull-down node and having a control terminal which is biased between the core supply terminal and the ground supply terminal; and a pull-down voltage protection transistor coupled between the pull-down node and the pad terminal and having a control terminal coupled to the core supply terminal.

* * * * *